US008023343B2

(12) United States Patent
Bringivijayaraghavan et al.

(10) Patent No.: US 8,023,343 B2
(45) Date of Patent: *Sep. 20, 2011

(54) SYSTEMS AND METHODS FOR ISSUING ADDRESS AND DATA SIGNALS TO A MEMORY ARRAY

(75) Inventors: Venkatraghavan Bringivijayaraghavan, Plano, TX (US); Jason Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/771,578

(22) Filed: Apr. 30, 2010

(65) Prior Publication Data

US 2010/0208533 A1    Aug. 19, 2010

Related U.S. Application Data

(63) Continuation of application No. 12/203,533, filed on Sep. 3, 2008, now Pat. No. 7,729,182.

(51) Int. Cl.
G11C 7/00 (2006.01)
(52) U.S. Cl. .............. 365/189.16; 365/189.12; 365/194; 365/189.05; 365/233
(58) Field of Classification Search ............. 365/189.16, 365/189.05, 194, 189.12, 233
See application file for complete search history.

(56) References Cited

U.S. PATENT DOCUMENTS

| 5,724,553 | A | 3/1998 | Shigeeda ............ 395/497.01 |
| 5,737,748 | A | 4/1998 | Shigeeda ................ 711/122 |
| 6,340,897 | B1 | 1/2002 | Lytle et al. ................ 326/40 |
| 6,990,076 | B1 | 1/2006 | McNamara et al. ........ 370/241 |
| 7,272,054 | B2 | 9/2007 | Waldrop ................ 365/191 |
| 2005/0268185 | A1* | 12/2005 | Vinke et al. .............. 714/718 |
| 2010/0054058 | A1 | 3/2010 | Bringivijayaraghavan et al. ............. 365/194 |

OTHER PUBLICATIONS

Brian Johnson, Brent Keeth, Feng Lin and Hua Zheng; "Phase-Tolerant Latency Control for a Combination 512Mb 1.0Gb/s/pin GDDR3 and 2.5Gb/s/pin GDDR SDRAM"; 2007 IEEE International Solid-State Circuits Conference, Session 27, DRAM and eRAM; pp. 494-495 & 617.

Feng Lin, Roman A. Royer, Brian Johnson and Brent Keeth; "A Wide-Range Mixed-Mode DLL for a Combination 512 Mb 2.0 Gb/s/pin GDDR3 and 2.5 and 2.5 Gb/s/pin GDDR4 SDRAM"; IEEE Journal of Solid-State Circuits, vol. 43, No. 3, Mar. 2008; pp. 631-641.

* cited by examiner

Primary Examiner — Son T Dinh
(74) Attorney, Agent, or Firm — Dorsey & Whitney LLP

(57) ABSTRACT

Embodiments of the present invention include circuitry for issuing address and data signals to a memory array using a system clock and a write clock. A locked loop may be used to compensate for additional delay experienced by the system clock relative to write clock and ensure synchronization of the clock signals. A write latch enable block may be used to develop a write latch enable signal for issuance along with a corresponding address signal. The write latch enable signal can be timed such that it arrives at an appropriate time to issue the data corresponding to the issued address.

20 Claims, 8 Drawing Sheets

SYSTEMS AND METHODS FOR ISSUING ADDRESS AND DATA SIGNALS TO A MEMORY ARRAY

CROSS REFERENCE TO RELATED APPLICATION

This application is a continuation of U.S. patent application Ser. No. 12/203,533, filed Sep. 3, 2008, and issued as U.S. Pat. No. 7,729,182 on Jun. 1, 2010. This application and patent are incorporated by reference herein, in their entirety, for any purpose.

TECHNICAL FIELD

Embodiments of the invention relate generally to semiconductor memory, and particularly, to the issuance of write data and address signals to a memory array.

BACKGROUND OF THE INVENTION

Memory systems may employ a plurality of clock signals, including a write clock signal and a system clock signal. The memory system may issue write data signals to the memory device in accordance with the write clock and issue command and address signals to the memory device in accordance with the system clock. Referring to FIG. 1, a memory system 10 includes a controller 20. The controller issues write clock 22 and system clock 24 signals to the memory device 30 having 128 data inputs (DQs) 32a-h and command and address inputs (not shown). The write clock signal 22 is routed to the device 30 at a plurality of write clock inputs 34a-h, each local to a respective group of DQs 32a-h.

The write clock signal 22 is issued to each DQ through local clock trees 36a-h. The memory system 10 of FIG. 1 includes a clock input for every 16 DQs and the device 30 includes 128 DQs, as shown. The system clock signal 24, however, is applied to the device 10 at a signal system clock input 40. The system clock signal 24 may be used throughout the memory device 30, for example, for clocking circuits to capture command and address signals in synchronicity with the system clock signal 24. While the system clock signal 24 may be used for a variety of functions on the memory device 20, the controller 20 issues address and command signals destined for the memory device 30 in accordance with the system clock signal 24. The system clock signal 24 is routed internally through a global clock tree 42 so that the system clock signal 24 can be used to synchronize various operations according to the system clock signal 24. The system clock signal 24 is also routed by the global clock tree 42 to each of the local clock trees 36a-h (connections not shown in FIG. 1 for simplicity).

Accordingly, write data signals are received in accordance with the write clock signal at each DQ 32a-h and command and address signals received in accordance with the system clock signal at the command and address inputs, respectively. For the memory device to accurately capture and match address signals with the correct corresponding write data, the write clock and system clocks should be in synch at the DQs and the address inputs. However, as shown in FIG. 1, the internal system and write clock paths may differ, and as a result, the system and write clocks would be out of synch by the time they reach the individual DQs 32a-h and address inputs. For example, the system clock experiences extra delay due, for example, to the global clock tree 42. Traditional systems ensure sufficient synchronization between the DQs and the address inputs by delaying the write clock signals an additional amount such that they are delayed by approximately the same amount as the system clock signal is delayed due to the different internal clock path.

As memory speeds continue to increase, however, the traditional method for ensuring write and system clock synchronization by delaying the write clock signal to match the system clock signal delay may fail. As clock speeds continue to increase, the delay from the system clock input 40 to the individual DQs 32a-h may be on the order of several clock periods. Furthermore, the delay experienced by the system clock signal will vary according to process, voltage and temperature conditions of the memory device 30.

Accordingly, simply delaying the write clock an additional amount to match a delay of the system clock may not suffice. For one thing, the process, voltage and temperature variation may not affect the delays in the same manner, continuing to contribute to a mismatch. Further, as the mismatch of delay increases to several clock periods, received data signals may be stored while waiting for receipt of the corresponding system clock signal. It may be difficult to know how much storage would be needed to accommodate the delay in receipt of the system clock signal. It is also difficult to match the received write data signals with the corresponding address signals that are received, routed and therefore delayed in the same manner as the system clock signal.

The problem is still further exacerbated because write data is captured at the frequency of the original write clock signal while the system clock may be internally divided by two on the memory device. Accordingly, phase control between the slower system clock and the faster write clock signal may be of increasing importance.

There is accordingly a need for a system of coupling write data and address signals to a memory device that accommodates the different routing of system clock and write clock signals such that the system clock and write clock signals are in synch and the correct address signals are matched with their corresponding write data.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, and timing protocols have not been shown in detail in order to avoid unnecessarily obscuring the described embodiments of the invention.

Figure 1:
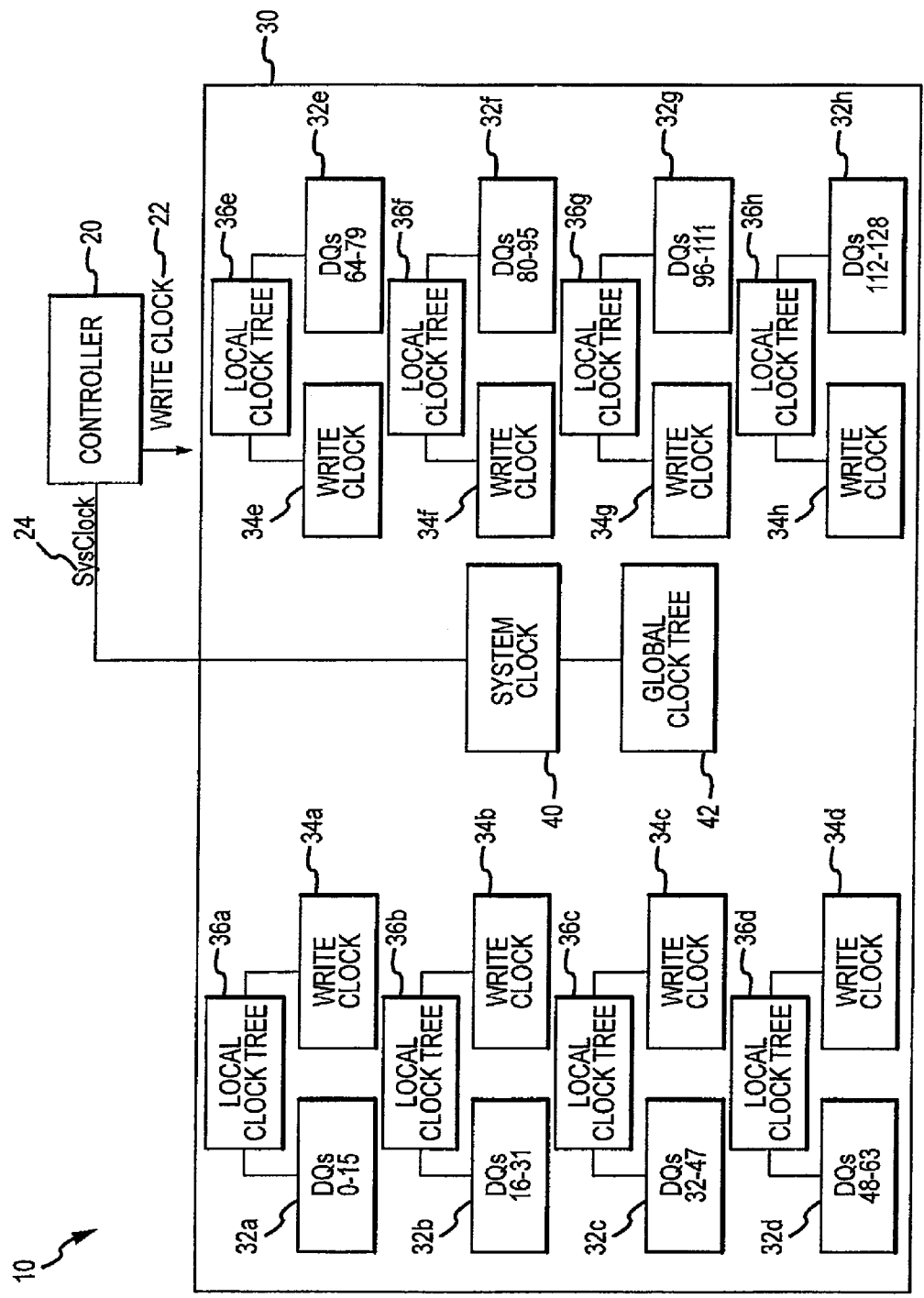
FIG. 1 is a schematic diagram of a memory device.
Figure 2:
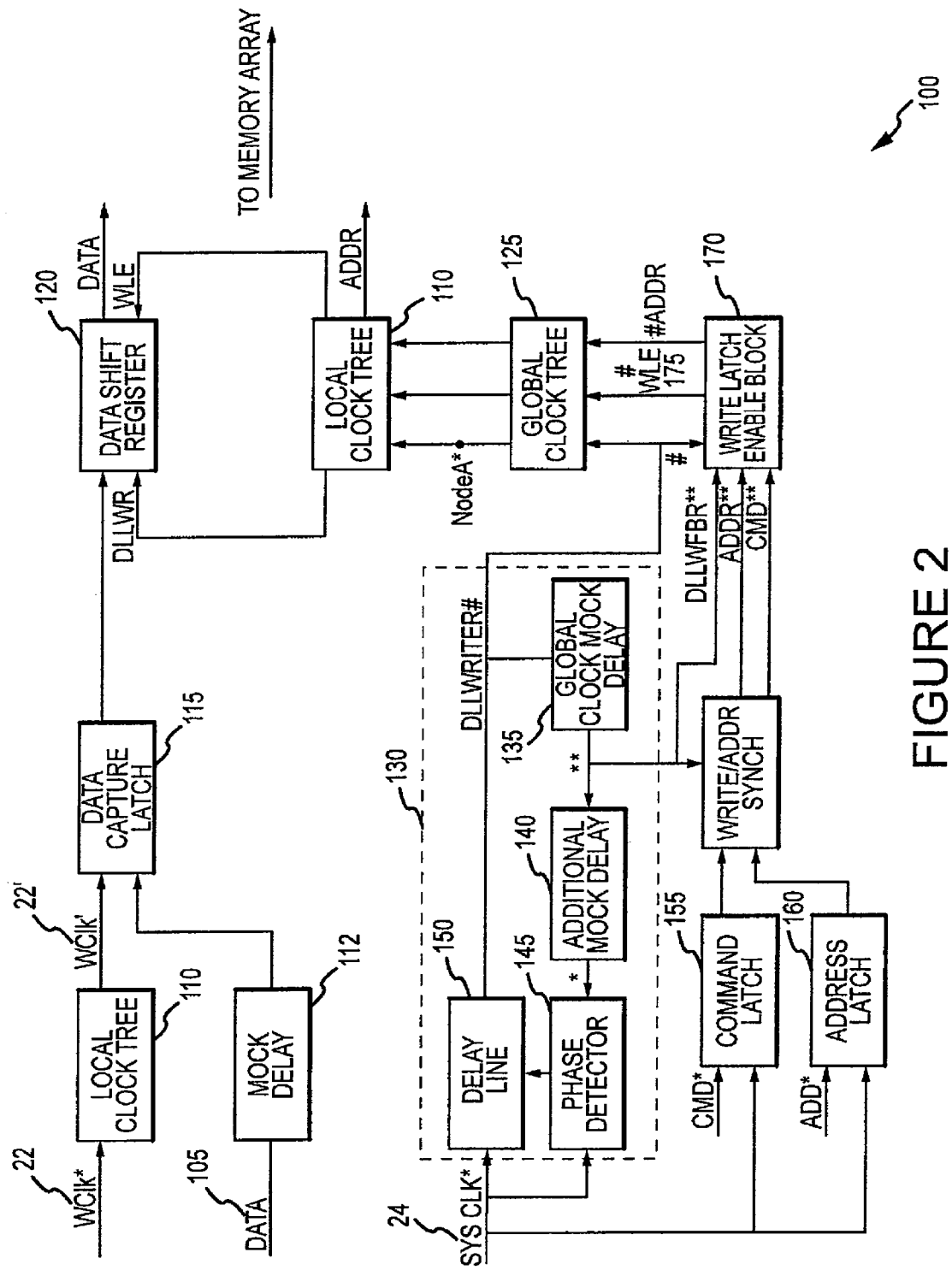
FIG. 2 is a schematic diagram of circuitry for issuing data and address commands to a memory array according to an embodiment of the present invention.

FIG. 2 depicts an embodiment of circuitry 100 for issuing data and address signals to a memory array for a memory access operation according to an embodiment of the present invention. A write clock signal 22, write data signal 105, and system clock signal 24 are generally in synch when provided to the circuitry 100. The write clock signal 22 is provided to a local clock tree 110, which in turn provides a write clock signal 22' to a data capture latch 115. The write data signal 105 is routed through a local clock tree mock delay 112 to the data capture latch 115, which captures the write data signal 105 responsive to the write clock signal 22'. The local clock tree mock delay 112 mimics the propagation delay of the local clock tree 110 that is added to the write clock signal 22. The write data stored in the data capture latch 115 is then latched into a data shift register 120 responsive to a signal, labeled DLLWR in FIG. 2, which is based on the system clock signal 24. The data capture latch 115 and data shift register 120 form at least a portion of one of the individual DQs generally shown in FIG. 1. The DLLWR signal should be synchronized with the write clock signal 22' for accurate latching of the write data into the data shift register 120.

However, as discussed above, the system clock signal 24 may experience a different delay than the write clock signal 22 at least in part due to the routing of the system clock signal 24 through a global clock tree 125. Thus, even if the system clock signal 24 and the write clock signal 22 are provided to the circuitry 100 in synch, typically the different internal propagation delays due to the different signal routing will result in the internal system and write clock signals being shifted out of synch. Further, the delay experienced by the system clock signal 24 may change differently with temperature and voltage variations, again in part due to its longer path. Recall, with reference to FIG. 1, the write clock signal 22 is not routed through the global clock tree 125. Accordingly, the delay experienced by the system clock may be greater and experience greater change with temperature and voltage variations than the delay experienced by the write clock signal.

A delay locked loop 130 synchronizes the DLLWR signal received by the data shift register 120 with the write clock signal 22'. The system clock signal 24 is input into the delay locked loop 130 which includes a global clock tree mock delay block 135. The global clock tree mock delay block mimics the delay imposed by the global clock tree 125. Additional mock delay 140 may also be implemented to model any further delay experienced by the system clock signal 24, described further below. A phase detector 145 receives the system clock signal 24 and the output of the additional mock delay 140 and adjusts a delay of a delay line such that the system clock signal 24 is synchronized with the output of the delay blocks 135 and 140. Accordingly, when the output of the delay line 150, DLLWriteR in FIG. 2, passes through the global clock tree 125, the resulting signal will be synchronized with the system clock signal 24.

Synchronization with the system clock signal is indicated in FIG. 2 by an asterisk (*) symbol. As previously discussed, the system clock 24 is shown as in synch with the write clock signal 22 when received at the circuitry 100 and in synch with the system clock signal as output from the global clock tree 125 at Node A in FIG. 2. The write clock signal and the signal at Node A are accordingly in synch. These signals may both then be routed through the local clock tree 110 and will accordingly remain in synch at the output of the local clock tree and the input to the data capture latch 115 and data shift register 120 respectively. In this manner, synchronization between the write clock signal 22 and system clock signal 24 may be achieved despite the signals experiencing different amounts of delay after receipt by a memory device.

The intermediate delayed system clock signal, shown as DLLWriteR in FIG. 2, defines a second timing synchronization domain, indicated by (#) in FIG. 2. Signals designated by # will generally be synchronized with signals indicated by * after passing through a global clock tree, or global clock tree mock delay. For example, the DLLWRiteR (#) signal, after passing through global clock mock delay block 135 becomes synchronized with (*) signals, indicated by the signal DLLWFBR (*) in FIG. 2.

Although a delay locked loop 130 is shown in FIG. 2, other locking mechanisms including phase locked loops may be used in other embodiments. Further, although both the write clock and a version of the system clock at Node A are depicted in FIG. 2 as routing through the local clock tree 110, it is to be understood that the signals may not be routed through the same physical connectors to progress through the local clock tree 110 in some embodiments. Rather, both may be passed through their own connectors that impose approximately a same amount of delay to route the signals to individual data latches or registers.

As will be described further below, a write latch enable block 170 selects the appropriate clock cycle to transmit a write latch enable signal 175 along with an appropriate address signal. By keeping track of the timing of received command and address signals, and taking into consideration the latency of the system, the write latch enable block 170 may ensure the appropriate address signal is provided for the memory access operation along with the corresponding write data from the data shift register 120. Operation of the write latch enable block 170 is further described below.

Figure 2A:
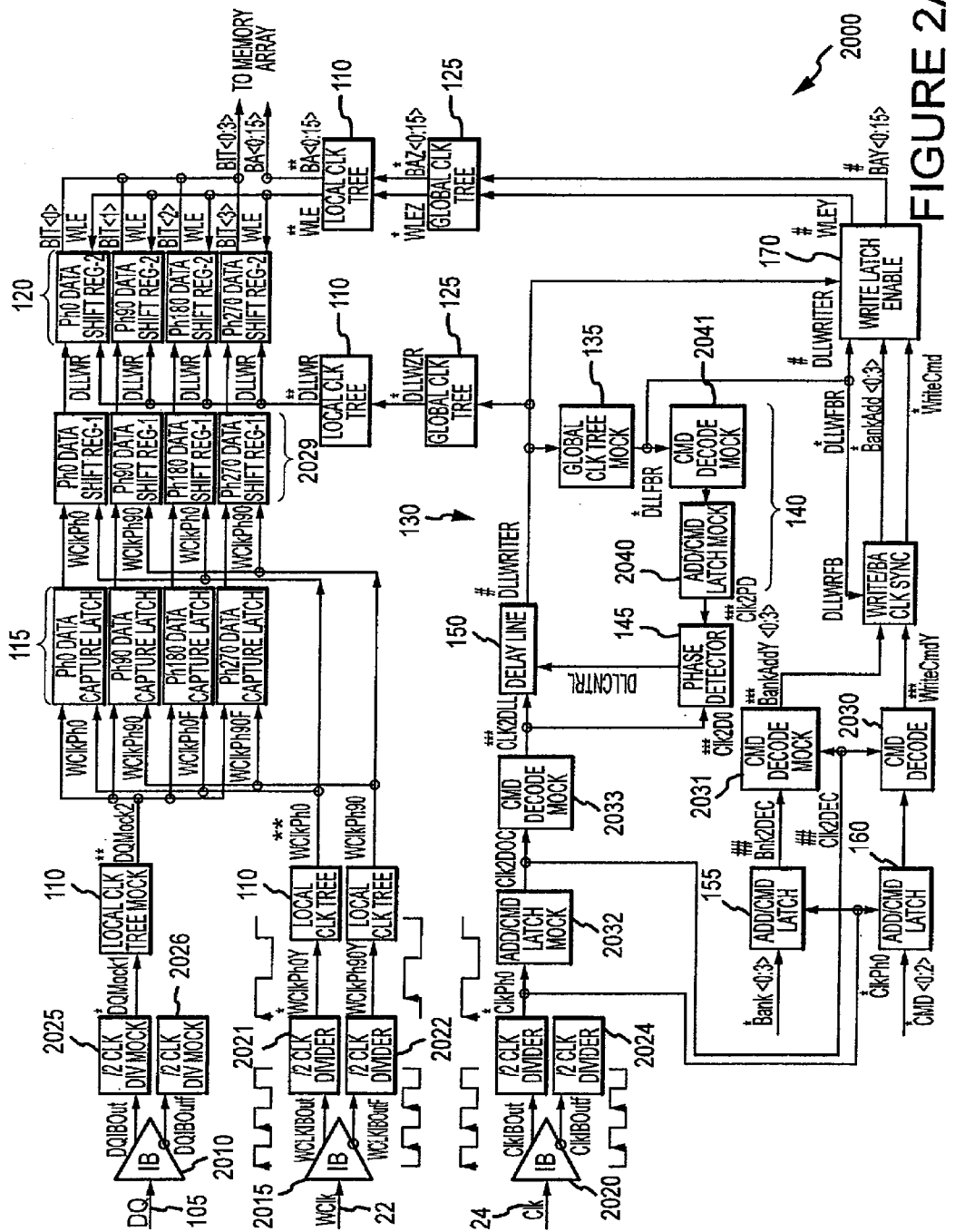
FIG. 2A is a schematic diagram of circuitry for issuing data and address commands to a memory array according to an embodiment of the present invention.

FIG. 2A depicts another embodiment of circuitry 2000 for providing write data and address signals for a memory access operation. Like components to the embodiment shown in FIG. 2 are labeled with like reference numbers, and some additional details are shown in FIG. 2A. Symbols are provided over some of the signal names to indicate which signals are in synchronization during operation. For example, signals labeled (*) are in synch with one another, signals labeled () are in synch with one another, and the same with signals labeled (*), (#), (##), and the like. Each of the write data 105, write clock signal 22, and system clock signal 24 are received by an input buffer 2010, 2015, and 2020, respectively. The input buffers 2010, 2015 and 2020 generate complementary output signals. The output complementary signals from the buffers 2015 and 2020 are subsequently sent to division blocks 2021-24 to divide their frequency by two. To compensate for the delay imposed by division blocks 2021-24, the complementary signals generated by the input buffer 2010 are provided to mock division blocks 2025 and 2026. As described with reference to FIG. 2, the write data 105 are subsequently captured by data capture latches 115 utilizing the write clock signal 22. An additional set of shift registers 2029 provides additional time for the processing of the command and address signals. The number of shift registers through which the write data is shifted prior to being issued to the memory array may vary in embodiments of the invention.

Command and address signals in FIG. 2A are latched by command and address latches 155 and 160. The commands are applied to a command decode block 2030. Accordingly, address signals are applied to a command decode block mock delay 2031 and the system clock signal 24 is coupled to both a latch mock delay 2032 and a decode mock delay 2033 in order to generally maintain synchronization of the command, address, and system clock signals. The DLL 130 shown in FIG. 2A accordingly includes a command latch mock delay 2040 and command decode mock delay 2041 as additional mock delay 140 of FIG. 2. The DLL 130 accordingly compensates for the propagation delays of the command latches 155, 160 and the command decode block 2030. As described above with reference to FIG. 2, the delayed system clock signal, DLLWriteR is routed through a global and local clock trees 125 and 110 resulting in a DLLWR signal provided to the data shift registers 120. Data signals are latched into the shift registers 120 in accordance with the DLLWR signal, which is generally synchronized with the write clock signal delayed by the local clock tree 110. The DLLWriteR signal is also used by the write latch enable block 170 to output a write latch enable and address signal. Write data are released from the data shift registers 120 responsive to receipt of the write latch enable signal as described further below.

Synchronization of the system clock 24 and the write clock signal 22 may be achieved at a write data register as described above with reference to FIGS. 2 and 2A. However, a challenge remains to ensure that a data signal is output of the data shift register 120 and provided to a memory array along with its corresponding address signal. Recall command and address signals issued by a controller will generally be followed by data signals issued a latency time later. The latency time is typically measured in clock cycles of the system clock. Accordingly, neglecting any delay, the memory device could simply hold the command and address signals while counting cycles of the system clock and issue the command and address signals after the appropriate number of clock cycles had elapsed. For example, if a memory device employed a latency of 15, the controller would issue a write command and address signal, wait fifteen clock cycles and then send the corresponding write data signals. Neglecting delay, the memory device would receive the command and address signals and wait the fifteen clock cycles (less any known processing or transit time) until receipt of the write data to issue the address signal, along with the write data, to the memory array. However, additional delay of the system clock signal in the system generally shown in FIG. 1 may vary over more than a clock cycle as clock frequencies increase, for example at 2 GHZ. What were once small delays that did not amount to the order of a clock cycle become of greater concern.

Figure 3:
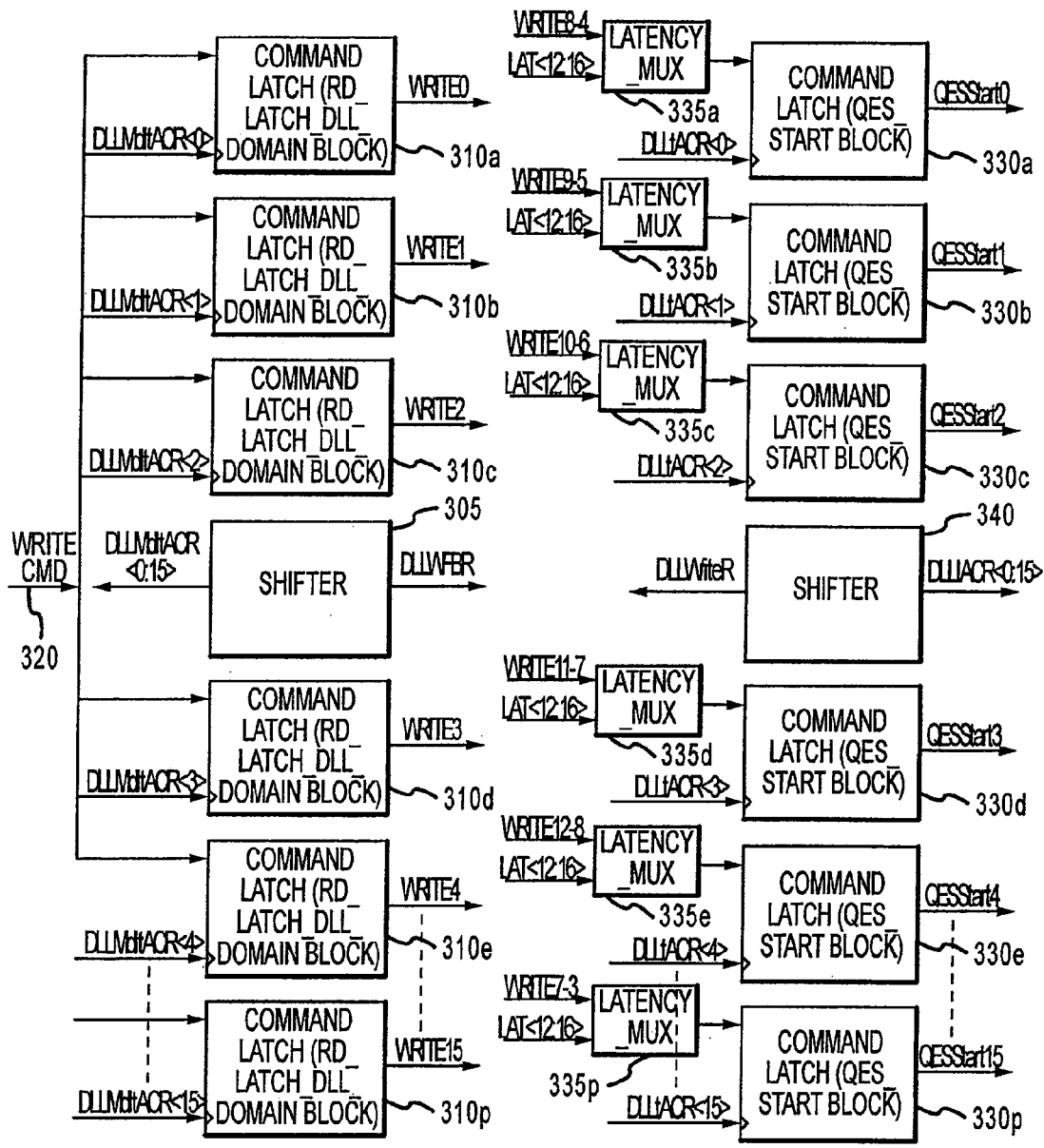
FIG. 3 is a schematic diagram of circuitry for storing and issuing command signals according to an embodiment of the present invention.

The write latch enable block 170 includes command storage, such as a series of command latches shown in FIG. 3. The write latch enable block 170 receives the DLLWFBR (*) signal and couples it to a shifter 305. Referring back to FIG. 2, recall the DLLWFBR signal is synchronized with the system clock and has experienced a global clock mock delay 135. The shifter 305, which may be implemented as a ring oscillator, outputs a plurality of timing signals shown as DLLMdltACR <0:15> in FIG. 3. The number of DLLMdlACR signals may correspond to a number of command latches 310a-p in FIG. 3. The number of command latches, and DLLMdlACR signals should be equal to or greater than the maximum latency of the memory system, which is 16 in the embodiment of FIG. 3.

Figure 4:
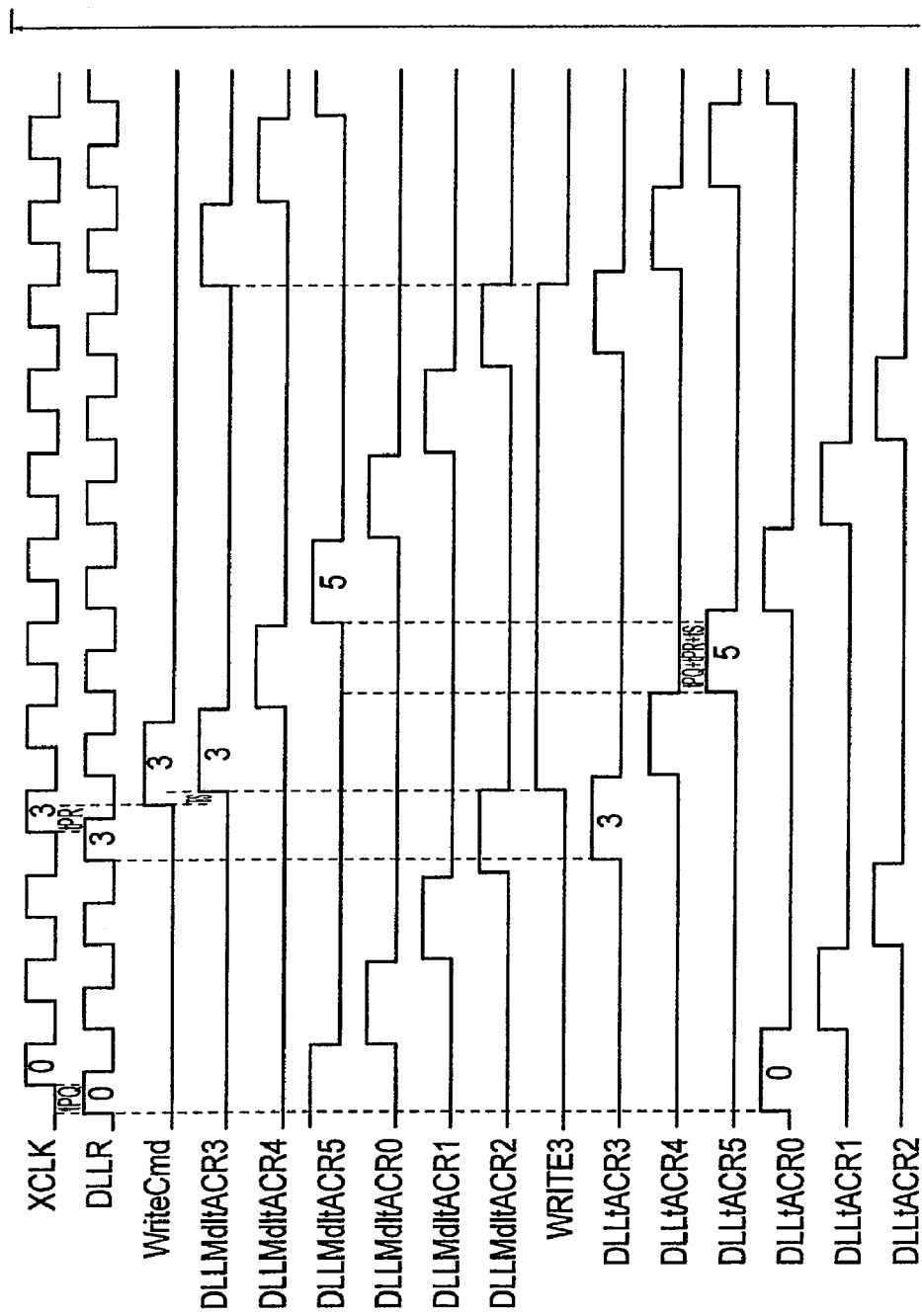
FIG. 4 is a timing diagram illustrating timing signals used in embodiments of the present invention.

FIG. 4 illustrates a timing diagram depicting the generation of DLLMdltACR signals. Each consecutive pulse of the DLLWFBR signal generates a single high pulse for each DLLMdltACR signal. Accordingly, each DLLMdltACR signal contains a high pulse every 6 clock cycles of DLLWFBR, as shown in FIG. 4, or every 16 cycles in the example of FIG. 3. In this manner, the DLLWFBR signals act as a counter, providing an identification of DLLWFBR cycles. An incoming write command 320 is received and coupled to the command latches 310a-p. The write command 320 is latched into the command latch receiving a high DLLMdltACR signal. For example, if write command 320 arrives during the $4^{th}$ DLLWFBR cycle, it will be latched by DLLMdltACR<3> into the command latch 310d.

Referring back to FIG. 3, commands in command latches 310a-p are coupled through to a second set of command latches 330a-p using latency multiplexers 335a-p. The latency multiplexers are coupled to a plurality of the command latches 310a-p in accordance with an available range of latencies in the memory system. In the example of FIG. 3, the system may support latencies of between 12-16. In the embodiment of FIG. 3, four clock cycles will be used to process the command once it exits one of the command latches 330a-p. Accordingly, for a latency of 16, a command should exit a command latch 12 cycles after being latched. For a latency of 12, a command should exit 8 cycles after being latched. Counting back from the maximum of 16 command latches, the first command latch 330a should therefore receive the command latched on the eighth cycle of the DLLWFBR signal, or command latch 310i (not shown) for a latency of 12. For a latency of 16, the command latch 330a should receive the command signal latched twelve cycles earlier, the command stored in register 310e in FIG. 3. Accordingly, the command latch 330a is coupled to receive any of the signals Write4-8 from the command latches 310a-p.

Command signals are issued from the command latches 330a-p in accordance with the signal DLLtACR shown in FIG. 3. The DLLtACR signals are generated by the shifter 340 in a similar manner to the generation of DLLMdltACR by the shifter 305. FIG. 4 illustrates a timing diagram depicting the generation of DLLtACR signals. Each consecutive pulse of the DLLWriteR (#) signal generates a single high pulse for each DLLtACR signal. Accordingly, each DLLtACR signal contains a high pulse every 6 clock cycles of DLLWriteR, as shown in FIG. 4, or every 16 cycles in the example of FIG. 3. In this manner, the DLLtACR signals act as a counter, providing an identification of DLLWriteR cycles. Accordingly, by latching commands into the latches 310a-p in accordance with the DLLWFBR signal and issuing commands from the latches 330a-p in accordance with the DLLWriteR signal, the system of FIG. 3 compensates for discrepancies between the DLLWriteR and DLLWFBR time domains while ensuring write commands are issued with the appropriate latency. The write commands are issued from the command latches 330a-p as signals QESStart0-15 shown in FIG. 3.

In this manner, write commands are stored into the write latch enable block 170 in accordance with cycles of a (*) time domain signal, DLLWFBR. The commands are issued from the stored registers in accordance with cycles of a (#) time domain signal, DLLWriteR. In this manner, the command latches may compensate for differences between the domains that are greater than one clock cycle.

Figure 5:
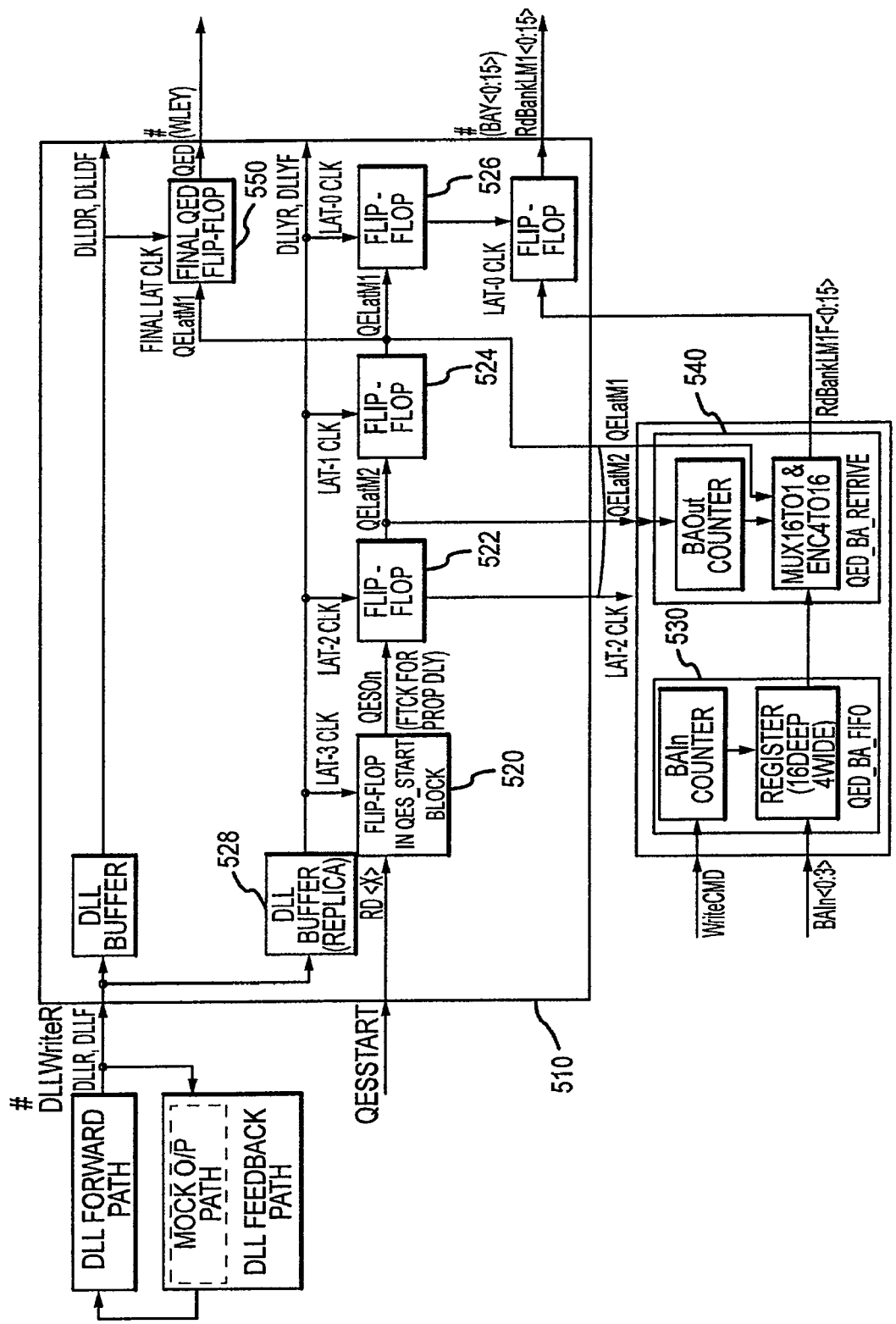
FIG. 5 is a schematic diagram of a timing block in accordance with an embodiment of the present invention.

The QESStart0-15 signals are coupled to a timing block 510 shown in FIG. 5. The timing block 510 also receives the DLLWriteR signal, shown in FIG. 2. The timing block 510 includes flip-flops 520, 522, 524, and 526 which generate clock pulses, timed with the DLLWriteR (#) signal after propagation through a buffer replica 528. Each of the flip-flops 520, 522, 524 and 526 generates a clock pulse representative of three, two, one, and zero clock pulses less than the latency of the system. For example, the flip-flop 520 receives the QESStart signal which, as described above, arrives in the embodiment of FIGS. 3-5 four clock cycles prior to the latency time. The flip-flop 520 generates a signal, Lat-3Clk at three clock cycles prior to the latency time. The flip-flop 522 generates a signal, Lat-2Clk, at two clock cycles prior to the latency time. The flip-flop 524 generates a signal Lat-1Clk, one cycle prior to the latency time. The flip-flop 526 generates a signal Lat-0Clk at the latency time. These signals, occurring at specific clock cycles prior to the latency time, can be used to clock out address signals at the appropriate time, as will be described below.

Figure 6:
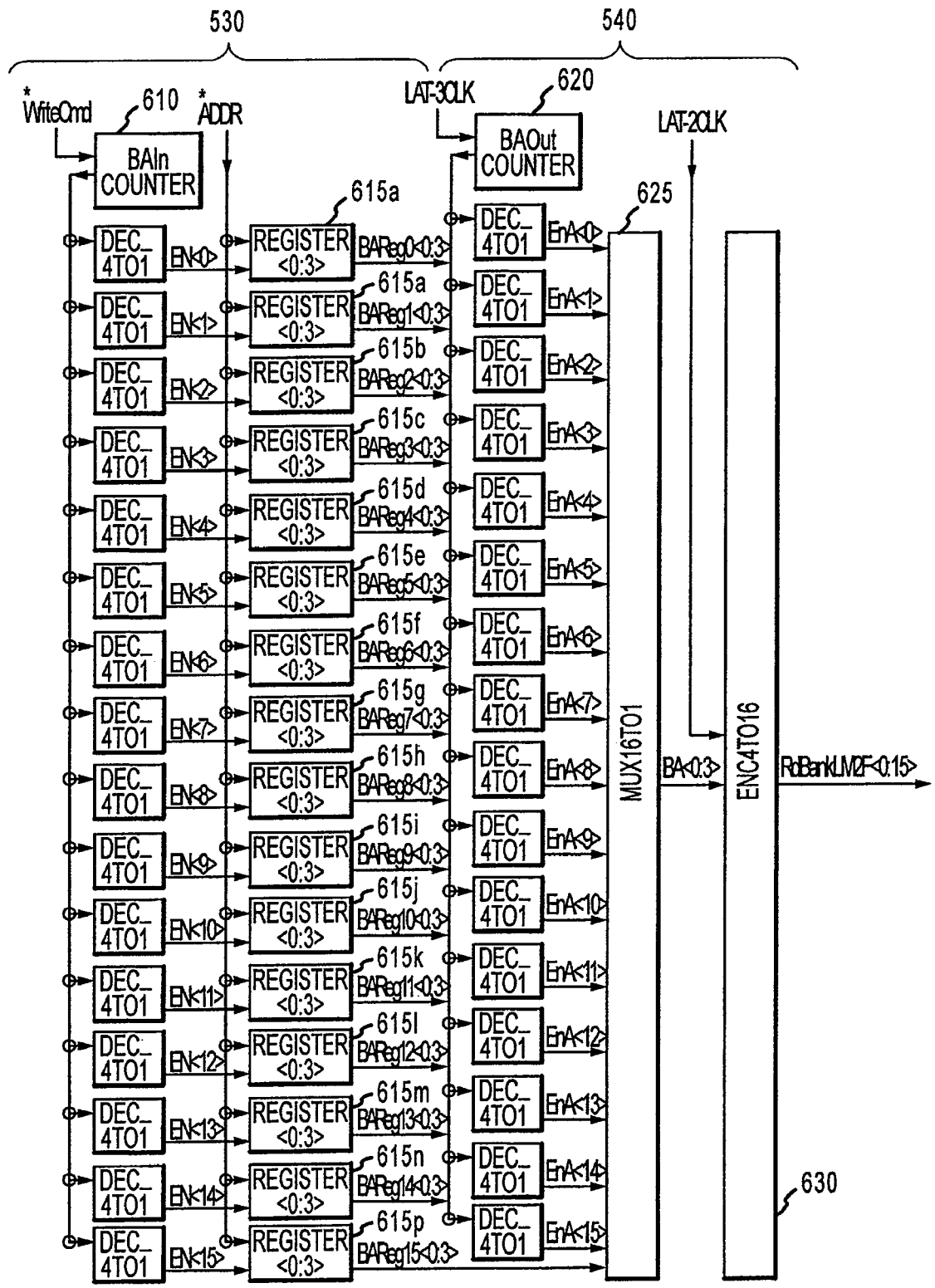
FIG. 6 is a schematic diagram of address storage and retrieval units in accordance with an embodiment of the present invention.

A qed_ba_fifo block 530 receives write command signals and address signals and stores the address signals. The address signals are passed to the qed_ba_retrieve block 540. The qed_ba_retrieve block 540 ensures the correct address signal is issued to correspond with an issued command signal. Utilizing the Lat-3Clk, Lat-2Clk, and Lat-1Clk signals, the qed_ba_retrieve block 540 issues an appropriate address signal, to be clocked out by the Lat-0Clk signal and provided to the memory array (not shown) as the address signal BAY<0:15>. The timing block 510 further generates a write latch enable signal, WLEY in FIG. 5, for application to the data shift register 120 of FIG. 2 to release the data corresponding to the bank address signal BAY<0:15>. The timing block 510 generates the write latch enable signal using flip-flop 550. The flip-flop 550 receives the QELatMI signal following output from flip-flop 524 using the Lat-1Clk. The flip-flop 550 then outputs the write latch enable signal using the DLL-WriteR signal. In this manner, the write latch enable signal is generated at the latency time and will be issued along with the corresponding address signal, as will be described below. Operation of the qed_ba_fifo and qed_ba_retrieve blocks 530 and 540 for issuance of the address signal will now be described with reference to FIG. 6.

The qued_ba_fifo block 530 includes a counter 610 that receives the write commands, and determines which of the registers 615*a-p* will be enabled responsive to the write command. The number of registers 615*a-p* provided in the qed_ba_fifo block 530 may be equal to the maximum latency, sixteen in the embodiment of FIG. 6. The registers 615*a-p* store received address signals. The counter 610 selects which of the registers 615*a-p* receives an incoming address signal. A second counter 620 receives the Lat-3Clk signal generated by the timing block 510 of FIG. 5. The counter 620 determines which of the registers 615*a-p* is coupled to the multiplexer 625. The selected address signal is then coupled from the multiplexer 625 to the decoder responsive to the Lat-2Clk signal generated by the timing block 510 of FIG. 5. In this manner, the selected address signal is issued from the qed_ba_retrieve block 540 to the timing block 510 of FIG. 5 for coupling to the memory array as the BAY<0:15> signal.

Figure 7:
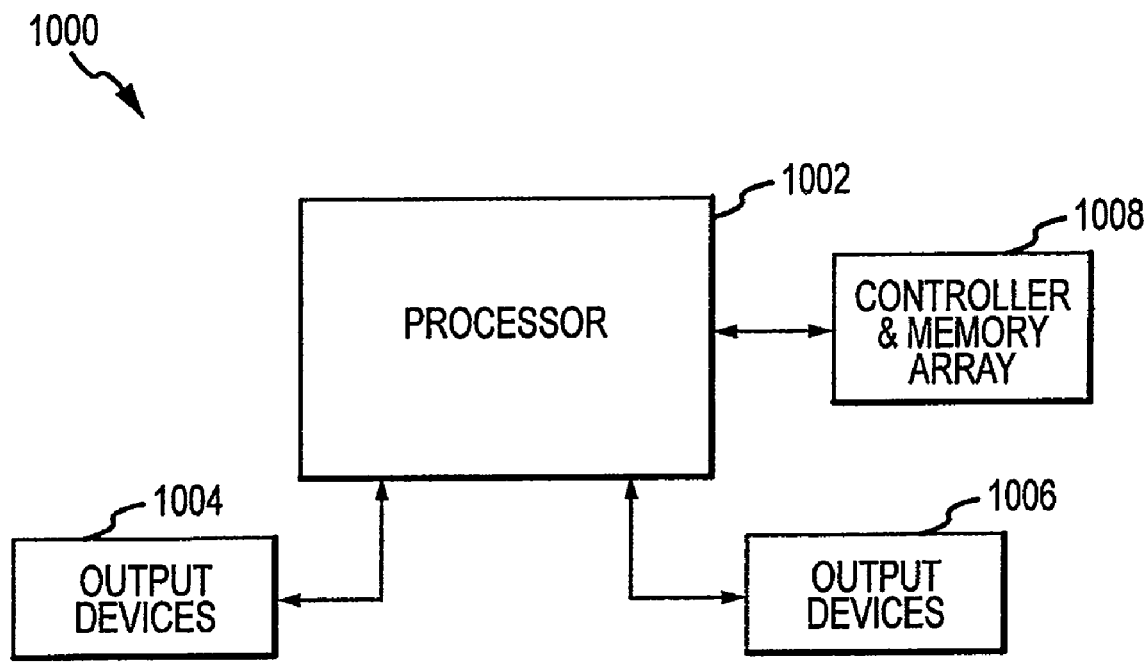
FIG. 7 is a schematic diagram of a processor-based system in accordance with an embodiment of the present invention.

FIG. 7 is a block diagram of a processor-based system 1000 including processor 1002, which is in communication with a memory controller and memory array 1008 having circuitry for providing memory access and clock synchronization components according to an embodiment of the present invention. In some embodiments, the memory controller may be integral with the processor 1002. The processor 1002 may be coupled through address, data, and control buses to the memory array 1008 to provide for writing data to and reading data from the memory array. The processor 1002 may include circuitry for performing various processing functions, such as executing specific software to perform specific calculations or tasks. In addition, the processor-based system 1000 may include one or more input devices 1004, such as a keyboard or a mouse, coupled to the processor 1002 to allow a user to interface with the processor-based system 1000. The processor-based system 1000 may also include one or more output devices 1006 coupled to the processor 1002, such as a display or printer. Output devices 1006 may also include further storage devices such as hard and floppy disks, tape cassettes, compact disk read-only ("CD-ROMs") and compact disk read-write ("CD-RW") memories, or digital video disks ("DVDs").

The processor-based system 1000 shown in FIG. 7 may be used in any of a variety of products employing processors and memory including for example cameras, phones, wireless devices, displays, chip sets, set top boxes, gaming systems, vehicles, and appliances. Resulting devices employing the processor-based system 1000 may benefit from the memory access and clock synchronization components and techniques described above to perform their ultimate user function.

From the foregoing it will be appreciated that, although specific embodiments of the invention have been described herein for purposes of illustration, various modifications may be made while still falling within the scope of the following claims.

What is claimed is:

1. A method for issuing write data and address signals to a memory array, the method comprising:
    generating an enable signal based, at least in part, on a delayed system clock signal and synchronized with at least one address signal retrieved from a selected address register;
    routing the enable signal and the address signal retrieved from the selected address register through a global clock tree and a local clock tree;
    issuing a data signal responsive, at least in part, to the enable signal; and
    issuing the address signal from the local clock tree.

2. The method of claim 1, further comprising:
    storing received address signals in respective selected address registers selected from a plurality of address registers in accordance with the system clock signal.

3. The method according to claim 2, wherein the act of storing received address signals in respective selected registers comprises counting a number of write commands received and selecting the address register corresponding to the number of write commands received.

4. The method of claim 2, further comprising:
    delaying the system clock signal an amount such that the delayed system clock signal will be synchronized with the write clock signal after routing through the global clock tree; and
    retrieving an address signal from the selected address register from the plurality of address registers in accordance with the delayed system clock signal.

5. The method of claim 4, wherein the selected address register for retrieval of an address signal contains the address signal corresponding to the data signal to be received after a latency time.

6. The method of claim 4, wherein the act of selecting the address register for storage of the address signal and the act of selecting the address register for retrieval of the address signal at least in part compensates for delay of the system clock signal relative to the write clock signal.

7. The method according to claim 1 further comprising:
    generating an intermediate signal based on the delayed clock signal, the intermediate signal corresponding to a received command signal and having a pulse a number of clock cycles before a latency time; and
    counting a number of the intermediate signals, and selecting the address register for retrieval of the address signal corresponding to the number of intermediate signals.

8. The method according to claim 7 wherein the act of generating the intermediate signal comprises:

latching the command signal in a selected one of a plurality of command latches corresponding to a number of a cycle of the system clock signal in which the command signal was received; and coupling the command signal to a second selected latch of a second plurality of command latches, the second selected latch corresponding to a number of a cycle of the delayed system clock signal and the latency time;

latching the command signal in the second selected latch responsive to receipt of a number of clock cycles of the delayed system clock signal corresponding to the second selected latch; and coupling the command signal from the second selected latch to a flip-flop for generation of the intermediate signal.

9. The method according to claim 7, wherein the act of generating the write latch enable signal occurs at least in part responsive to generation of the intermediate signal.

10. The method according to claim 1, further comprising:
routing write data signals and a write clock signal through the local clock tree;
storing the write data signals responsive, at least in part, to the write clock signal from the local clock tree; and
capturing the write data signals from the stored write data signals responsive to the delayed system clock signal.

11. A write latch enable block comprising:
command storage configured to latch commands responsive to a first clock signal and issue commands responsive to a second clock signal and configured to store a plurality of commands, the command storage configured to count a number of cycles of the second clock signal and select a stored command to issue corresponding to a latency time and the number of counted cycles;
a timing block configured to receive the issued command and the second clock signal and generate a timing signal at least in part responsive to the issued command, the timing signal having a pulse a respective number of clock cycles before the latency time, the timing block further configured to generate a write latch enable signal at the latency time; and
an address retrieval unit configured to issue a stored address corresponding to the issued command at the latency time.

12. The write latch enable block of claim 11, further comprising:
an address storage unit configured to receive commands and addresses, the address storage configured to count a number of received commands and store received addresses in a location corresponding to the number of received commands.

13. The write latch enable block of claim 12 wherein the address storage unit comprises a first counter configured to receive commands and count the number of received commands, the address storage unit further comprising a plurality of address registers coupled to the counter and configured to receive addresses and store each address in one of the plurality of address registers corresponding to a count of the first counter.

14. The write latch enable block of claim 13 wherein the address retrieval unit comprises a second counter coupled to receive the timing signal and count the number of received timing signals, the address retrieval unit further comprising a multiplexer coupled to the plurality of address registers and the second counter, the multiplexer configured to select the location for retrieving the stored address based on the second counter.

15. The write latch enable block of claim 11, wherein the address retrieval unit is configured to receive the timing signal and count a number of received timing signals, the address retrieval unit operable to retrieve the stored address from a location corresponding to the number of received timing signals.

16. The write latch enable block of claim 11, wherein the command storage further comprises:
a first ring oscillator coupled to receive the first clock signal and generate a first plurality of intermediate signals based on the first clock signal, a pulse of each of the first intermediate signals corresponding to a number of counted cycles of the first clock signal;
a first plurality of command latches coupled to receive the commands, each coupled to receive a respective one of the first intermediate signals and latch the commands responsive to the respective first intermediate signal;
a second ring oscillator coupled to receive the second clock signal and generate a second plurality of intermediate signals based on the second clock signal, a pulse of each of the second intermediate signals corresponding to a number of counted cycles of the second clock signal; and
a second plurality of command latches coupled to the first plurality of command latches, the second plurality of command latches configured to receive a command from a selected one of the first plurality of command latches responsive to the respective second intermediate signal, the selected one corresponding to the latency time.

17. The write latch enable block of claim 16 further comprising a plurality of multiplexers coupled to the second plurality of command latches, the plurality of multiplexers configured to select the selected one of the first plurality of command latches.

18. The write latch enable block of claim 11 wherein the first and second clock signals are related by a delay time.

19. The write latch enable block of claim 11 wherein the timing block comprises a flip-flop configured to receive the second clock signal and the command issued from the second plurality of command latches and generate the timing signal responsive to receipt of the command.

20. The write latch enable block of claim 11 wherein the timing block is configured to couple the write latch enable signal and the address to a memory array.

* * * * *